(12) United States Patent
Saito

(10) Patent No.: US 12,349,471 B2
(45) Date of Patent: Jul. 1, 2025

(54) SOLAR PANEL, ELECTRONIC INSTRUMENT, AND ELECTRONIC TIMEPIECE

(71) Applicant: CASIO COMPUTER CO., LTD., Tokyo (JP)

(72) Inventor: Yuta Saito, Tachikawa (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 80 days.

(21) Appl. No.: 17/773,365

(22) PCT Filed: Oct. 16, 2020

(86) PCT No.: PCT/JP2020/039022
§ 371 (c)(1),
(2) Date: Apr. 29, 2022

(87) PCT Pub. No.: WO2021/085166
PCT Pub. Date: May 6, 2021

(65) Prior Publication Data
US 2024/0178333 A1    May 30, 2024

(30) Foreign Application Priority Data

Oct. 30, 2019    (JP) .................................. 2019-196874

(51) Int. Cl.
*H10F 19/37*    (2025.01)
*G04C 10/02*    (2006.01)
(Continued)

(52) U.S. Cl.
CPC ............. *H10F 19/37* (2025.01); *G04C 10/02* (2013.01); *G04G 9/00* (2013.01); *H10F 77/315* (2025.01)

(58) Field of Classification Search
CPC .......... H01L 31/0468; H01L 31/02168; G04C 10/02; G04G 9/00; H10F 19/37; H10F 77/315; H10F 77/311; H10F 77/42
See application file for complete search history.

(56) References Cited

U.S. PATENT DOCUMENTS 5,438,556 A * 8/1995 Dinger ................. H01G 9/2068
429/111
5,761,158 A * 6/1998 Azuma .................. G04B 19/14
429/111

(Continued)

FOREIGN PATENT DOCUMENTS

| JP | 2019-164112 A | 9/2019 |
|---|---|---|
| WO | WO 00/31596 A1 | 3/2000 |
| WO | 2001-250971 A | 9/2001 |

OTHER PUBLICATIONS

First Office Action dated Apr. 7, 2024 received in Chinese Patent Application No. CN 202080076298.8.

(Continued)

*Primary Examiner* — Edwin A. Leon
*Assistant Examiner* — Sean R Brannon
(74) *Attorney, Agent, or Firm* — Scully, Scott, Murphy & Presser, P.C.

(57) ABSTRACT

A solar panel is provided on a visible side of a display panel and includes a transmissive area, a power generator and an anti-reflector. The transmissive area transmits light. The power generator generates electric power from light. The anti-reflector is provided on a display-panel-facing surface of the power generator to prevent reflection of light on the power generator. The display-panel-facing surface of the power generator faces the display panel. The light, the reflection of which is prevented by the anti-reflector, is (Continued)

among light having passed through the transmissive area and been reflected by the display panel.

12 Claims, 4 Drawing Sheets

(51) Int. Cl.
    *G04G 9/00*          (2006.01)
    *H10F 77/30*      (2025.01)

(56) References Cited

U.S. PATENT DOCUMENTS

| | | | | |
|---|---|---|---|---|
| 6,791,905 | B1* | 9/2004 | Sekiguchi | G04C 10/02 368/80 |
| 10,256,358 | B2* | 4/2019 | Gilbert | G09F 13/14 |
| 2014/0060643 | A1* | 3/2014 | Martin | H01L 31/072 502/1 |
| 2015/0299035 | A1* | 10/2015 | Kuksenkov | G02B 1/118 65/17.2 |
| 2019/0286061 | A1 | 9/2019 | Morita et al. | |

OTHER PUBLICATIONS

Extended European Search Report dated Nov. 7, 2023 received in European Patent Application No. EP 20882360.9.
Notice of Reasons for Refusal dated Aug. 29, 2023 received in Japanese Patent Application No. JP 2019-196874.
International Preliminary Report on Patentability and Written Opinion dated May 3, 2022 received in International Application No. PCT/JP2020/039022 together with an English language translation.

* cited by examiner

SOLAR PANEL, ELECTRONIC INSTRUMENT, AND ELECTRONIC TIMEPIECE

CROSS-REFERENCE TO RELATED APPLICATION

This application is a national stage entry of PCT International Application No. PCT PCT/JP2020/039022, filed on Oct. 16, 2020, which is based upon and claims the benefit of priority from Japanese Patent Application No. 2019-196874 filed Oct. 30, 2019, the entire contents of which are incorporated herein by reference.

TECHNICAL FIELD

The present invention relates to solar panels, electronic devices and electronic timepieces.

BACKGROUND ART

There has been widely known an electronic device, such as a timepiece (electronic timepiece), having a solar panel that receives light and generates electric power.

In order to ensure a large amount of electric power that is generated by a solar panel, there is an idea of generating electric power efficiently by disposing power generators at positions including where a display is disposed in an electronic device.

More specifically, for example, the solar panel is disposed therein that is configured by thin-line power generators and light transmitters, which transmit light, being alternately disposed to be hardly seen from outside. The solar panel thus configured does not impair external appearance of an electronic device, and also can ensure visibility of the display disposed under the solar panel.

In this type of solar panel, on the surface of the thin-line power generators facing the display, a metal electrode layer is disposed, so that the surface is in a state in which specular reflection is likely to occur.

Further, for example, in JP 2015-527605 A, there is disclosed a technology for increasing luminosity of images on a display by daring to cover the surface of thin-line power generators facing the display with a light-reflective layer made of, for example, white ink, white paint or metal plating of aluminum or chrome having a mirror effect.

SUMMARY OF INVENTION

However, in the case of such a configuration in which specular reflection is likely to occur on the back surface of the power generators, an area where images at different points are displayed in an overlapped state due to reflection of light may appear, and/or right next to a dark area, a bright area having light density higher than that of other areas may appear.

These reduce the visibility of information displayed on the display, thereby making the displayed information hard to see and something strange for its user.

The present invention has been conceived in view of the above circumstances, and objects thereof include providing a solar panel, an electronic device and an electronic timepiece that do not impair the visibility of a display and are capable of generating electric power efficiently with the solar panel laid on a display panel of the display.

Solution to Problem

In order to solve the aforementioned problem(s), a solar panel of the present invention is a solar panel that is provided on a visible side of a display panel, including:
  a transmissive area that transmits light;
  a power generator that generates electric power from light; and
  an anti-reflector that is provided on a display-panel-facing surface of the power generator facing the display panel to prevent reflection of light on the power generator, the light being among light having passed through the transmissive area and been reflected by the display panel.

Advantageous Effects of Invention

The present invention has an effect of not impairing the visibility of the display and being capable of generating electric power efficiently with the solar panel laid on the display panel.

DESCRIPTION OF EMBODIMENTS

With reference to FIG. 1 to FIG. 6, an embodiment(s) of a solar panel according to the present invention and an electronic timepiece as an electronic device to which this solar panel is applied will be described.

Although various limitations technically preferable for carrying out the present invention are put on the embodiments described below, the scope of the present invention is not limited to the following embodiments or illustrated examples.

Figure 1:
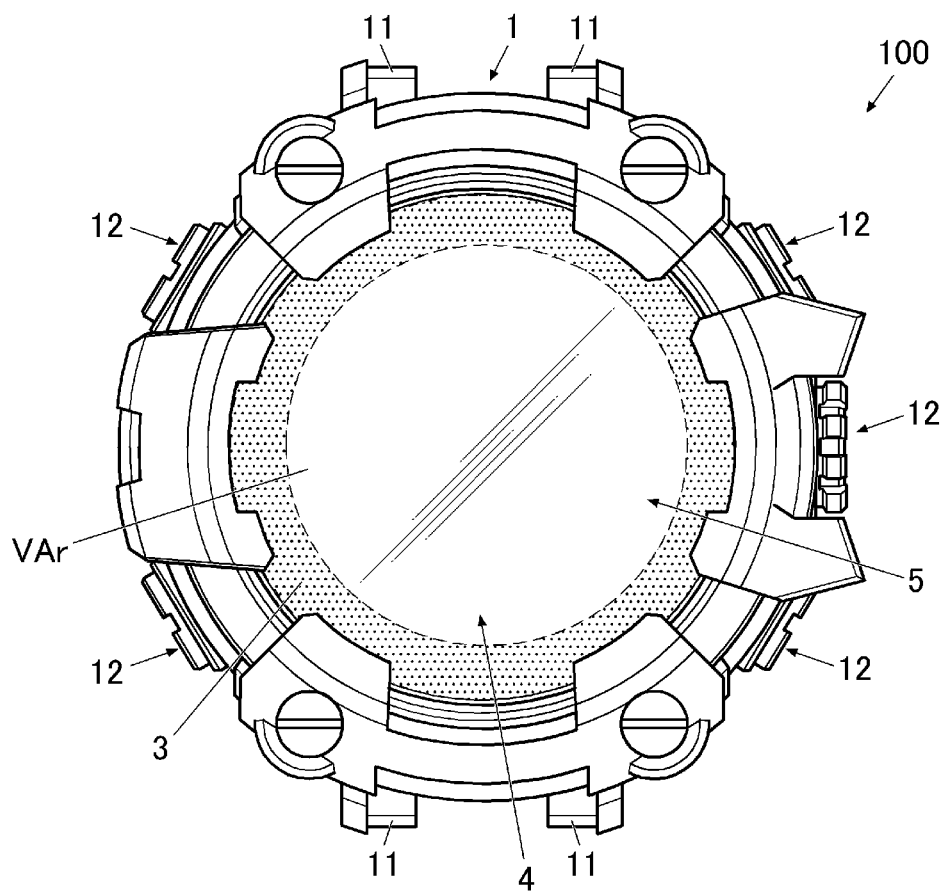
FIG. 1 is a front view of a timepiece in an embodiment(s).

FIG. 1 is a front view of an electronic timepiece (hereinafter simply referred to as "timepiece") as an electronic device in an embodiment(s).

As shown in FIG. 1, a timepiece 100 of this embodiment includes a case (hereinafter referred to as "body case 1" in this embodiment). The body case 1 is formed of a hard material, such as hard synthetic resin or metal exemplified by titanium and stainless steel (SUS). The material forming the body case 1 is not limited to those exemplified herein.

The body case 1 of this embodiment is formed in the shape of a short hollow column that opens vertically in the thickness direction of the case (front and back of the timepiece).

At the upper end and the lower end of the body case 1 in FIG. 1, which are the end in the 12 o'clock direction and the end in the 6 o'clock direction in an analog timepiece, belt attaching parts 11 are disposed. To the belt attaching parts 11, a not-shown timepiece belt is attached.

The timepiece 100 includes operation buttons 12 on the lateral side or the like of the body case 1. In the example shown in FIG. 1, five operation buttons 12 in total, two buttons on the left side and three buttons on the right side, are disposed.

At the opening on the front surface side of the body case 1 (visible side or upper side of the timepiece), an optically transparent crystal 3 formed of transparent glass or the like is disposed to cover the opening.

On the back surface side of the body case 1, a not-shown back cover that closes the opening is attached.

In this embodiment, it is preferable that the outer periphery on the lower surface (surface placed inside the body case 1) of the crystal 3 be a ring-shaped decorative part (not shown). As the decorative part, it is entirely patterned, colored or the like by a method that does not interfere with optical transparency (light transmission properties), and provided with letters and/or symbols as various logos, gradations, and/or the like. This allows the decorative part to have a function as a blindfold that covers connectors and so forth disposed on the outer periphery of a display 4, a solar panel 5 and so forth housed in the body case 1 to be invisible from the outside.

The method for forming the decorative part is not particularly limited, but the decorative part may be formed, for example, by performing printing, any type of vapor deposition or the like on the lower surface of the crystal 3.

The body case 1 of this embodiment also houses a module (not-shown timepiece module including a timer circuit as a timer that performs timekeeping) that causes components of the timepiece 100, which is an electronic device, to operate.

Between the upper side (visible side or front surface side of the timepiece) of the module and the crystal 3, the display 4 including a display panel 41 (shown in FIG. 6) that is configured, for example, by a liquid crystal display (LCD), an organic electroluminescent display or another flat display is disposed. The display panel 41 is arranged under (i.e., on the invisible side of) the solar panel 5, which will be described later.

The display panel 41 is not particularly limited in configuration. For example, the display panel 41 may be a reflective liquid crystal display or a transmissive liquid crystal display with a backlight.

Although not shown in FIG. 1, the display 4 displays time, various kinds of information and so forth.

The display 4 is not particularly limited in configuration, but may have an analog display part including a dial and hands, or may have both the analog display part and a digital display part including a liquid crystal panel.

As described above, the outer periphery (outer peripheral edge or the like) of the display 4 is covered with the decorative part to be invisible from the outside.

In this embodiment, the area surrounded by the decorative part (area substantially circular shown in white in FIG. 1) is a visible area VAr, which is visible from the outside, in the display 4.

Between the display 4 (display panel 41) and the crystal 3, the solar panel 5 is disposed. In other words, the solar panel 5 is laid on the visible side (front surface side of the timepiece) of the display 4 (display panel 41 of the display 4) as indicated by a broken line in FIG. 1. For example, the solar panel 5 is disposed on the back surface side of the crystal 3 with not-shown double-sided adhesive tape or the like.

Figure 2:
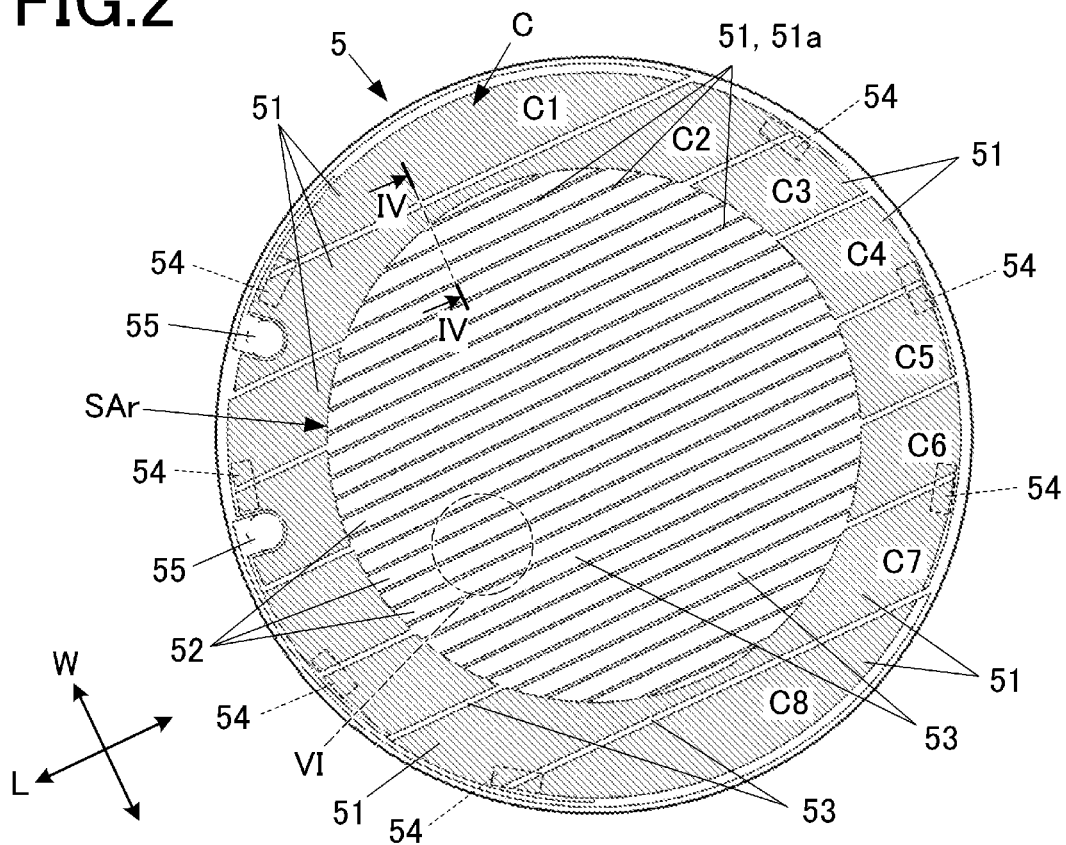
FIG. 2 is a plan view of a solar panel in the embodiment.

FIG. 2 is a plan view of the solar panel in this embodiment.

The solar panel 5 includes power generators 51 (which include thin-line power generators 51a) that function as solar cells receiving light and generating electric power. The electric power generated by the solar panel 5 performing photovoltaic power generation is stored in a not-shown secondary cell.

As shown in FIG. 2, the solar panel 5 of this embodiment includes plate-like cells (solar cells C) each formed in the shape of a belt extending in the planar direction. The cells are arranged in parallel in the cell width direction W perpendicular to the extending direction L.

The solar cells C are separated from one another by partition areas 53. In this embodiment, the partition areas 53 are each formed in the shape of a belt having a width equal to the width of a transmissive area(s) 52, which will be described below, from one end to the other end in the extending direction L.

The solar panel 5 includes connectors 54 that electrically connect the solar cells C in series at the ends of the solar cells C in the extending direction L.

The connectors 54 are disposed across the partition areas 53, which separate the solar cells C from one another.

The solar cells C connected to one another at the connectors 54 constitute the solar panel 5 as a single unit.

In this embodiment, the connectors 54 are disposed outside the aforementioned visible area VAr to be invisible from the outside.

The solar panel 5 further includes two terminals 55. One of the terminals 55 is electrically connected to a positive electrode on a not-shown substrate of the module or the like, and the other one of the terminals 55 is electrically connected to a negative electrode on the substrate.

The terminals 55 are not particularly limited in position, but, in FIG. 2, disposed at an end of a solar cell C2 and an end of a solar cell C4, for example.

The number of the cells (solar cells C) constituting the solar panel 5 is not particularly limited. FIG. 2 shows an example in which eight cells C (solar cells C1 to C8 in FIG. 2) are connected in series, thereby constituting the solar panel 5.

As the number of the solar cells C connected in series is larger, the voltage of the solar panel 5 as a whole is higher. Hence, it is preferable that the number of the solar cells C constituting the solar panel 5 be suitably determined according to the required level of voltage, for example, the voltage of the secondary cell that stores the electric power generated by the solar panel 5.

At least one of the solar cells C, i.e., C1 to C8, includes a transmissive power generation area SAr in which the power generators 51, which generate electric power from light, and the transmissive areas 52, which transmit light, extend along the extending direction L and are alternately arranged.

In this embodiment, at least part of the solar cells C that corresponds to the aforementioned visible area VAr, which is visible from the outside, is configured as the transmissive power generation area SAr.

The power generators 51 in the transmissive power generation area SAr are arranged at regular intervals.

For example, of the power generators 51, the power generators 51 disposed in the transmissive power generation area SAr are thin-line power generators 51a each formed in the shape of a thin line having a width narrower than that of the transmissive area(s) 52.

The thin-line power generators 51a in the transmissive power generation area SAr are arranged at regular intervals, which, with the solar cells C disposed on the upper side (visible side, front surface side) of the display panel 41 (shown in FIG. 6) of the display 4, provides uniform brightness as the entire surface and hence makes the thin-line power generators 51*a* inconspicuous when the display 4 is viewed from the outside. This can achieve excellent visibility of the display 4 and highly attractive external appearance.

In this embodiment, the "power generators 51" include both the thin-line power generators 51*a* and the other power generators 51 unless otherwise stated.

The thin-line power generators 51*a* are not particularly limited in thinness (dimension in the cell width direction W), but, for example, may each be about 10 µm if the thinness (dimension in the cell width direction W) of the transmissive area(s) 52 is about 70 µm.

As the width (dimension in the cell width direction W) of the thin-line power generators 51*a* is smaller (thinner) and the width (dimension in the cell width direction W) of the transmissive areas 52 is larger (thicker), the transparency of the transmissive power generation area SAr of the solar panel 5 is higher, which results in improvement of the visibility in the visible area VAr of the display 4. Meanwhile, as the width of the thin-line power generators 51*a* is smaller, the power generation amount is smaller and also resistance of charge transfer (movement) in the solar cells C is higher, which results in decrease in the power generation efficiency.

Hence, the width of the thin-line power generators 51*a* and the width of the transmissive areas 52 are suitably determined to strike a balance between the degree of the visibility required for the visible area VAr of the display 4 (i.e., the degree of the transparency of the transmissive power generation area SAr, which is provided to correspond to the visible area VAr) and the power generation amount and/or the degree of the power generation efficiency required for the solar panel 5.

In the case where two or more solar cells C are connected in series, thereby constituting the single solar panel 5, if the solar cells C have different output current values, the output current value of the solar panel 5 becomes small in accordance with, among the solar cells C, the solar cell C having the smallest output current value.

In order to improve the power generation efficiency, it is preferable that the areas (square measures) of the power generators 51 in the respective solar cells C be as equal as possible.

In this embodiment, as shown in FIG. 2, for example, the areas (square measures) of the solar cells C1, C8, each of which is a solar cell C in which the power generator(s) 51 is formed almost entirely, are small, whereas the areas (square measures) of the solar cells C4, C5, each of which is a solar cell C most of which corresponds to the transmissive power generation area SAr and that has many thin-line power generators 51*a*, are relatively large. Thus, the solar cells C1 to C8 are adjusted to have almost the same total area (square measure) of the power generators 51, which include the thin-line power generators 51*a*, in their solar cells C.

In the case where part of the power generators 51 is covered with a material having low optical transparency or the like, such as a case where part of the decorative part is provided with a logo or the like formed of a metal part, the power generation amount of the power generator(s) 51 having the low optical transparency part is low.

If the intervals or the like of the thin-line power generators 51*a* in the transmissive power generation area SAr are made to vary from one another to deal with the above, it greatly affects the external appearance and the visibility, for example, generates stripes that are conspicuous when viewed.

Hence, it is preferable that the solar cells C be adjusted to have almost the same total area of the power generators 51, for example, by changing the shape(s) of the power generators 51 outside the transmissive power generation area SAr (power generators 51 disposed outside the part corresponding to the visible area VAr). In this case, the solar cell(s) C may taper, swell or curve at the ends, for example. In other words, the overall shape of the solar cell(s) C may not be a perfect belt shape or strip shape as shown in the drawings for this embodiment.

Figure 3:
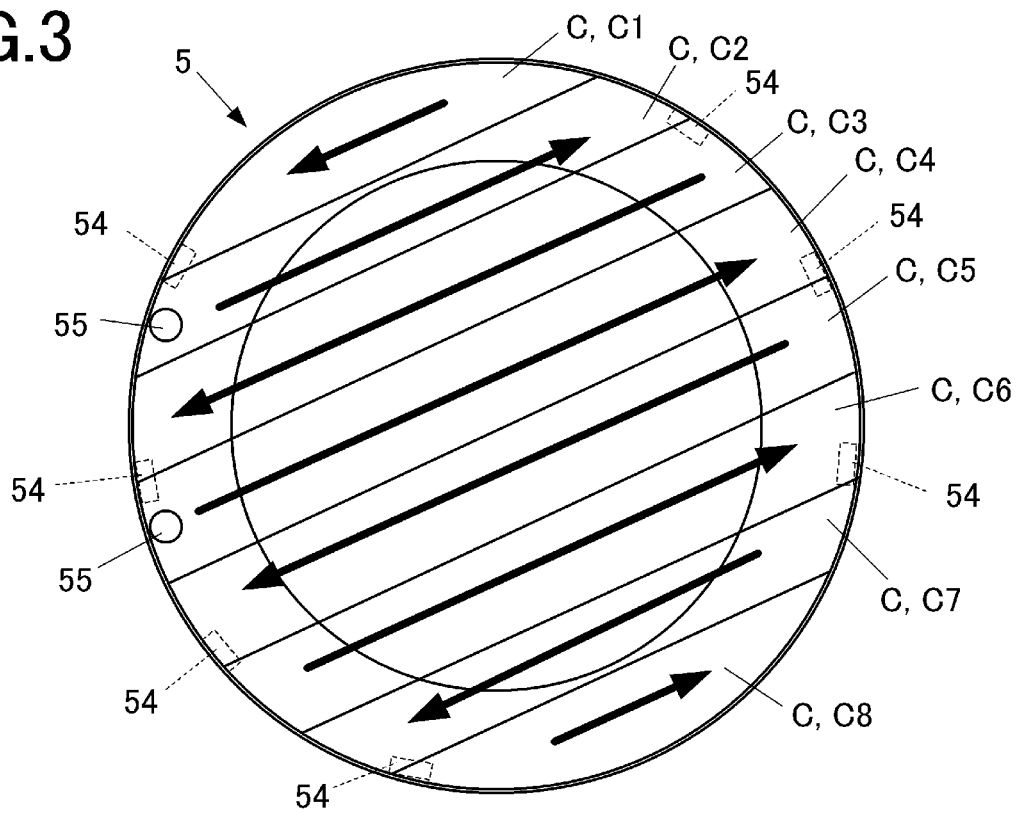
FIG. 3 is an explanatory illustration showing an example of the direction of charge movement in the solar panel shown in FIG. 2.

FIG. 3 is an explanatory illustration schematically showing the direction of charge movement in this embodiment.

In this embodiment, as shown in FIG. 3, the connectors 54, which connect the solar cells C, are alternately disposed at one end and the other end in the extending direction L such that electric charges alternately move from one end to the other end in the extending direction L and vice versa, from the solar cell C1 to the solar cell C8.

The arrangement and configuration shown in FIG. 3 are examples, and not all the connectors 54 need to be alternately disposed at one end and the other end in the extending direction L. The connectors 54 are alternately disposed at one end and the other end in the extending direction L in the case where the solar cells C in each of which the transmissive power generation area SAr is at least partly provided over the entire width in the cell width direction W are disposed in succession.

Figure 4:
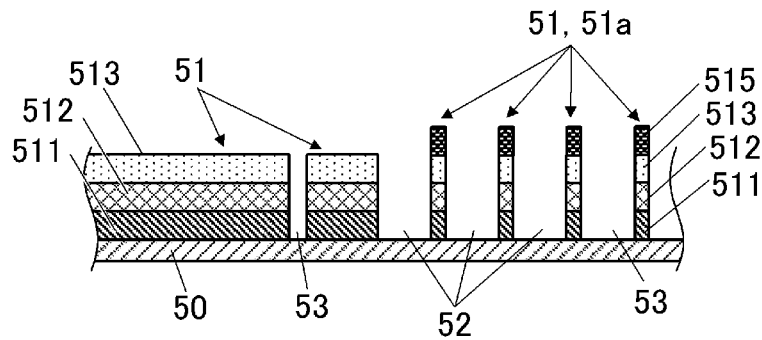
FIG. 4 is a sectional view along IV-IV line in FIG. 2.

FIG. 4 is a sectional view along IV-IV line in FIG. 2.

As shown in FIG. 4, the solar panel 5 includes, on a base material 50, the power generators 51, the transmissive areas 52 and the partition areas 53, which separate the solar cells C from one another.

Among these, the power generators 51 have a layered structure in which a semiconductor layer 512 and a back surface electrode 513 are stacked in this order on a transmissive electrode 511 formed on the base material 50. A transmissive sealing material (protective layer) may be disposed to cover the base material 50 all over from above the layered structure.

In this embodiment, on the upper side of the back surface electrode 513 (i.e., display-panel-facing surface/side of the power generators 51, which faces the display panel 41 in the state in which the solar panel 5 is fitted in the timepiece 100), a light-absorbing layer 515 is disposed as an anti-reflector to prevent reflection of light entering the power generators 51 from the display panel 41 side. In the case where the aforementioned protective layer is provided, the light-absorbing layer 515 may be disposed either above or under the protective layer.

The transmissive areas 52 and the partition areas 53 are each an area where none of the transmissive electrode 511, the semiconductor layer 512 and the back surface electrode 513 is present, and hence only the base material 50 is present.

The transmissive areas 52 and the partition areas 53 may be formed by keeping unstacked areas on the base material 50 without stacking the transmissive electrode 511, the semiconductor layer 512 and the back surface electrode 513 therein, or may be formed by, after stacking the transmissive electrode 511, the semiconductor layer 512 and the back surface electrode 513 on the base material 50, removing these layers as appropriate. The method for removing the transmissive electrode 511 and so forth is not particularly limited, but laser processing or the like may be used.

The base material 50 is a thin, plate-like substrate having optical transparency, for example, a flexible, film-like transmissive plastic. The material forming the base material 50 is not limited to those exemplified herein. Examples thereof include various kinds of transparent resin and glass.

The transmissive electrode 511 is formed, for example, by crystallizing zinc oxide, indium oxide, tin oxide or the like. The material and method for forming the transmissive electrode 511 are not limited thereto.

The semiconductor layer 512 is formed of amorphous silicon (a-Si:H), for example. As the semiconductor layer 512, a p-n junction semiconductor in which a p-type semiconductor and an n-type semiconductor are joined is used, for example.

The back surface electrode 513 is formed of a metal material, such as an aluminum conductor, contained. The material forming the back surface electrode 513 is not limited thereto.

The semiconductor layer 512 and the back surface electrode 513 are stacked/formed over the base material 50, for example, by vapor deposition or another method. The method for disposing the semiconductor layer 512 and the back surface electrode 513 over the base material 50 is not limited thereto.

The light-absorbing layer 515, which is an anti-reflector, is a light absorber formed on the surface of the power generators 51 facing the display panel 41, and is made of ink, a metal film or the like of a dark color, black for example, approved as having a light absorbing effect. The material forming the light-absorbing layer 515 is not particularly limited as far as the light-absorbing layer 515 can prevent reflection of light entering it from the display panel 41 side. For example, the material may be a light absorber having a light absorbing effect that makes reflectance of light in a range from about 400 nm to about 800 nm, which is considered human visible light, 40% or less.

As shown in FIG. 4, the light-absorbing layer 515 is disposed on the back surface electrode 513 of the thin-line power generators 51a, which are disposed in the transmissive power generation area SAr, among the power generators 51. Since the back surface electrode 513 is formed of, for example, aluminum, SUS or the like, it is in a mirror plane state if not processed at all, and light entering the back surface electrode 531 is specularly reflected. The light-absorbing layer 515 absorbs the light entering the back surface electrode 513 of the thin-line power generators 51a, thereby preventing the light from being reflected by the back surface electrode 513, which results in bringing its user neither a sense of strangeness nor difficulty in seeing when he/she looks at the display 4.

The method for forming the light-absorbing layer 515 is not particularly limited. The light-absorbing layer 515 is disposed to correspond to each thin-line power generator 51a. If the light-absorbing layer 515 is formed beyond the area of each thin-line power generator 51a, it may impair the visibility of the display panel 41 or generate conspicuous blackish lines. Hence, it is preferable that the light-absorbing layer 515 be properly disposed in each thin area, and therefore be a film that can be generated by fine patterning, such as photolithography or nanoimprinting.

Next, operation of the solar panel 5 in this embodiment and that of the timepiece 100 as an electronic device including the solar panel 5 will be described.

In this embodiment, the solar panel 5 is placed on the upper side of the display 4 (display panel 41 of the display 4), which is disposed on the visible side of the timepiece 100. The solar panel 5 is disposed such that the transmissive power generation area SAr corresponds to the visible area VAr of the display 4.

The transmissive power generation area SAr is configured by the thin-line power generators 51a and the transmissive areas 52 being arranged with their longer directions in parallel. Hence, the solar panel 5 disposed on the upper side of the display 4 does not impair the visibility of the display 4, and also, since the power generators 51a can be provided on the upper side of the display 4 too, can have a high power generation amount as compared with power generators being provided only on the outer periphery of the display 4.

The solar panel 5 disposed on the visible side of the timepiece 100, on the upper side of the display to be more specific, causes the power generators 51 of the solar cells C1 to C8 to perform effective photovoltaic power generation when light is incident on the solar panel 5 through the crystal 3. The solar cells C are connected by the connectors, thereby constituting the single solar panel 5, and the electric power generated by the solar panel 5 as a whole is stored in the secondary cell. A sufficient amount of electric power is supplied from the secondary cell to various action parts, such as a motor for the module, thereby driving the timepiece 100.

Further, in this embodiment, on the surface of the thin-line power generators 51a facing the display panel 41, the light-absorbing layer 515, which absorbs light, is disposed.

This prevents occurrence of difficulty in seeing when looking at the display 4, which occurs by light entering the back surface electrode 513 being reflected thereby, the back surface electrode 513 being disposed on the back surface side (display-panel-facing surface/side, which faces the display panel 41) of the thin-line power generators 51a.

Hereinafter, difference in refection of light between a case where the light-absorbing layer 515 is not provided and a case where the light-absorbing layer 515 is provided will be described with reference to FIG. 5 and FIG. 6.

Figure 5:
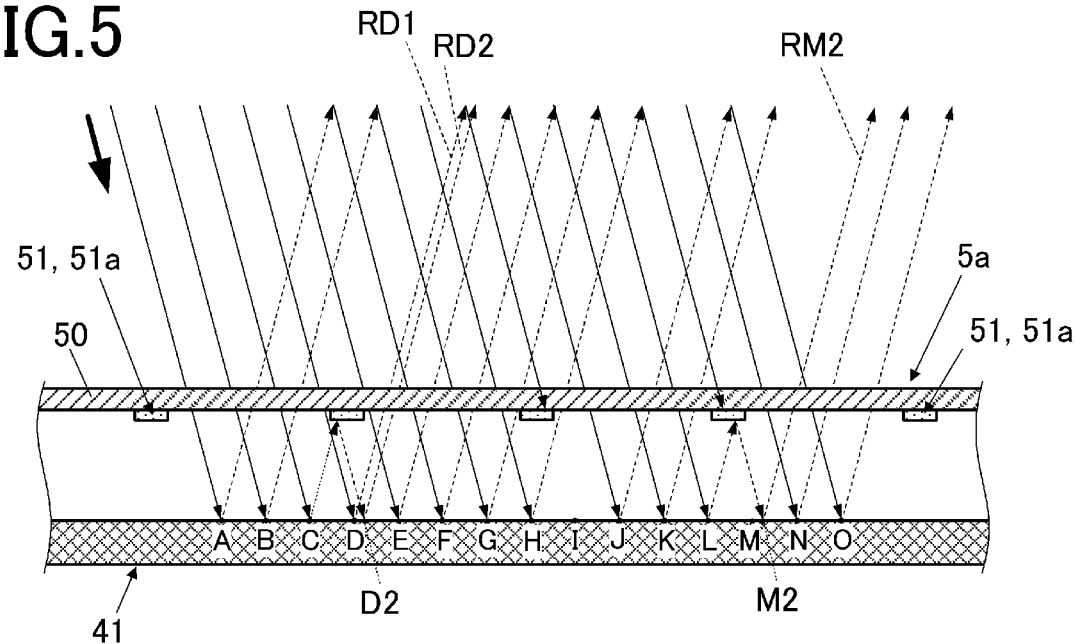
FIG. 5 is an illustration to explain reflection of light when light is incident on a conventional solar panel.
Figure 6:
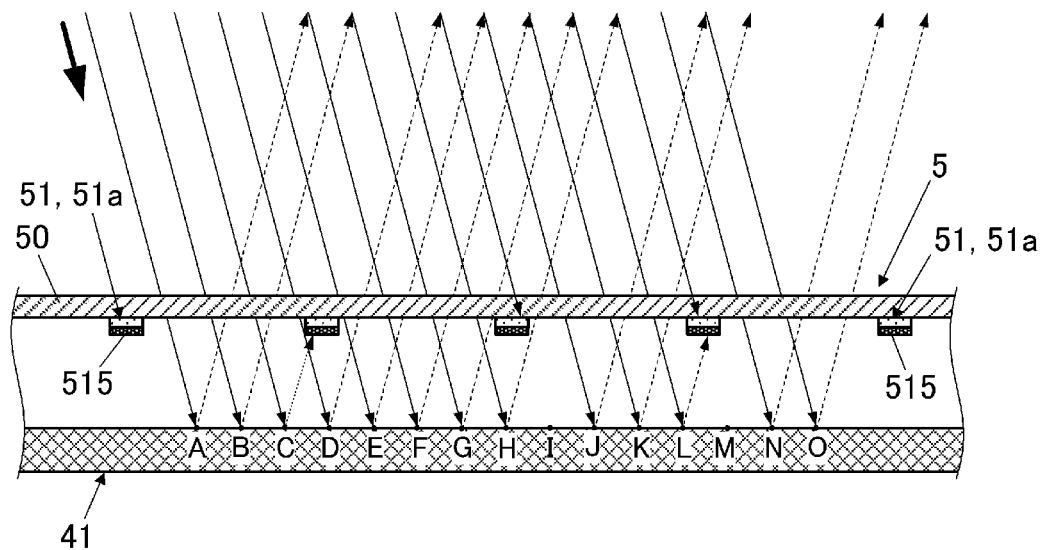
FIG. 6 is an illustration to explain reflection of light when light is incident on the solar panel of the embodiment.

FIG. 5 and FIG. 6 schematically show reflection of light in a part circled as an area VI in FIG. 2.

FIG. 5 shows a case where the back surface electrode 513 of a solar panel 5a is not processed to prevent reflection, so that the surface of the back surface electrode 513 facing the display panel 41 is in a white or silver mirror plane state or a similar smooth plane state. The bold downward arrow on the left side in FIG. 5 indicates the incident direction of light. In FIG. 5, incident light is indicated by solid lines, and reflected light is indicated by broken lines.

Images displayed on the display panel 41 are schematically shown, from the left side in FIG. 5, as points A, B, C, D, E, F, G, H, I, J, K, L, M, N and O. For example, at or near point D in FIG. 5, natural reflected light RD1, which is light incident and reflected on the surface (point D) of the display panel 41, and reflected light RD2 (re-reflected light), which is light once reflected on the surface (point C) of the display panel 41 and thereafter reflected on the back surface of the back surface electrode 513 and again reflected on the surface (point D2) of the display panel 41, appear.

In this case, the reflected light RD1 and the reflected light RD2 reach the user's eyes, and the displayed images are viewed in an overlapped state.

Further, for example, at or near point M in FIG. 5, natural reflected light does not appear because incident light is blocked by the thin-line power generator 51a and does not reach the surface (point M) of the display panel 41 accordingly, but reflected light RM2 (re-reflected light), which is light once reflected on the surface (point L) of the display panel 41 and thereafter reflected on the back surface of the back surface electrode 513 and again reflected on the surface (point M2) of the display 41, appears.

In this case, a bright area due to the reflected light RM2, which does not appear naturally, appears next to a dark area due to no appearance of the natural reflected light. As a result, unnatural brightness difference is caught by the user's eyes.

In contrast, FIG. 6 shows a case where the light-absorbing layer 515 is disposed on the back surface electrode 513. The bold downward arrow on the left side in FIG. 6 and the solid lines and the broken lines in FIG. 6 indicate the same as those in FIG. 5.

As shown in FIG. 6, in the case where the light-absorbing layer 515 is disposed on the back surface electrode 513, the light-absorbing layer 515 absorbs light entering the back surface electrode 513 from the display panel 41 side, thereby preventing reflected light (e.g., reflected light RD2 and reflected light RM2 in FIG. 5) except natural reflected light from appearing.

This makes it possible to deliver true indications at original display points as they are to the user, namely, to perform natural and highly visible display. At points where incident light is blocked by the thin-line power generators 51a and does not reach the display panel 41 accordingly, images are partly missing. However, since natural display can be performed, the user can easily imagine and supplement the missing parts of the displayed images. Thus, the visibility of the display 4 is improved in the end.

Further, provision of the light-absorbing layer 515 can prevent reflected light from appearing at points where reflected light does not appear naturally. This reduces the difference in brightness due to difference in light density caused by light being reflected by the back surface electrode 513, which is the back surface of the thin-line power generators 51a. In the configuration shown in FIG. 5, as described above, a bright area due to the reflected light RM2, which does not appear naturally, appears next to a dark area due to no appearance of natural reflected light, so that dark areas and bright areas appear alternately and a stripe pattern or the like is sighted. In contrast, in the configuration of this embodiment, no stripe pattern or the like appears, so that a display screen having high visibility and not bringing the user a sense of strangeness can be provided for the user.

As described above, according to this embodiment, the solar panel 5 that is laid on the visible side of the display panel 41 includes the transmissive areas 52 that transmit light, the power generators 51 that generate electric power from light, and the light-absorbing layer 515 as an anti-reflector that is formed on the surface of the power generators 51 (thin-line power generators 51a) facing the display panel 41 to prevent reflection of light entering the power generators 51 (thin-line power generators 51a) after passing through the transmissive areas 52, which transmit light, and being reflected by the display panel 41.

Thus, since the solar panel 5 is laid on the visible side of the display panel, the power generation efficiency of the solar panel 5 can be improved and the power generation amount of the solar panel 5 can be increased.

Although the solar panel 5 is laid on the display panel 41, since the light-absorbing layer 515 prevents reflected light that does not correspond to natural incident light from appearing, excellent visibility can be ensured on the display panel 41.

Thus, both the power generation efficiency of the solar panel 5 and the visibility of the display panel 41 can be achieved.

Further, in this embodiment, part of the power generators 51 corresponding to the display area (visible area VAr) of the display panel 41 is configured as the transmissive power generation area SAr, the power generators 51 of which are hard to see from the outside, and the light-absorbing layer 515 as the anti-reflector is formed on the surface of the power generators 51 (thin-line power generators 51a) in the transmissive power generation area SAr facing the display panel 41.

Thus, since the transmissive power generation area SAr is superimposed on the display area (visible area VAr) of the display panel 41, improvement of the power generation efficiency of the solar panel 5 can be achieved without sacrificing the visibility of the display panel 41.

Further, in this embodiment, the power generator(s) 51 in the transmissive power generation area SAr are the thin-line power generators 51a, and the light-absorbing layer 515 as the anti-reflector is formed on the surface of the thin-line power generators 51a facing the display panel 41.

Hence, although the power generators 51 are laid on the part corresponding to the visible area VAr, the visibility of the display 4 is not impaired, and also the external appearance is made excellent. Disposition of the light-absorbing layer 515 on the thin-line power generators 51 can achieve excellent visibility.

Further, in this embodiment, the light-absorbing layer 515 as the anti-reflector is a light absorber formed on the surface of the power generators 51 (thin-line power generators 51a) facing the display panel 41.

This can effectively prevent light entering the power generators 51 (thin-line power generators 51a) from the display panel 41 side from being re-reflected by the display panel 41 and sighted, and achieve excellent visibility accordingly.

Further, the anti-reflector (light-absorbing layer 515 in this embodiment) configured to make the reflectance of light in the range from about 400 nm to about 800 nm, which is considered human visible light, 40% or less can effectively prevent reflected light from being sighted by the user, and achieve excellent visibility accordingly.

Further, in the case where the solar panel 5 of this embodiment is applied to the timepiece 100 as an electronic device, the visibility of the display 4 can be ensured, and also the power generation efficiency of the solar panel 5 can be improved.

Hence, the timepiece 100 (electronic device) with easy viewing of time, various functional indicators/indications and so forth can be provided, and also a sufficient amount of electric power can be ensured by the solar panel 5 even if the timepiece 100 (electronic device) includes functional parts that require much electric power.

Although one or more embodiments of the present invention have been described above, it goes without saying that the present invention is not limited to the embodiments, but can be modified in a variety of respects within a range not departing from the scope of the present invention.

For example, in the above embodiment, the anti-reflector is formed on the surface of the power generators 51 (thin-line power generators 51a) facing the display panel 41, but it may be any as far as it can prevent reflection of light entering the power generators 51 from the display panel 41 side.

For example, the anti-reflector may be an anti-reflector having been subjected to a process to prevent specular reflection, or may be a light diffuser that is the surface of the power generators 51 facing the display panel 41 having been subjected to a process to diffuse light.

Figure 7:
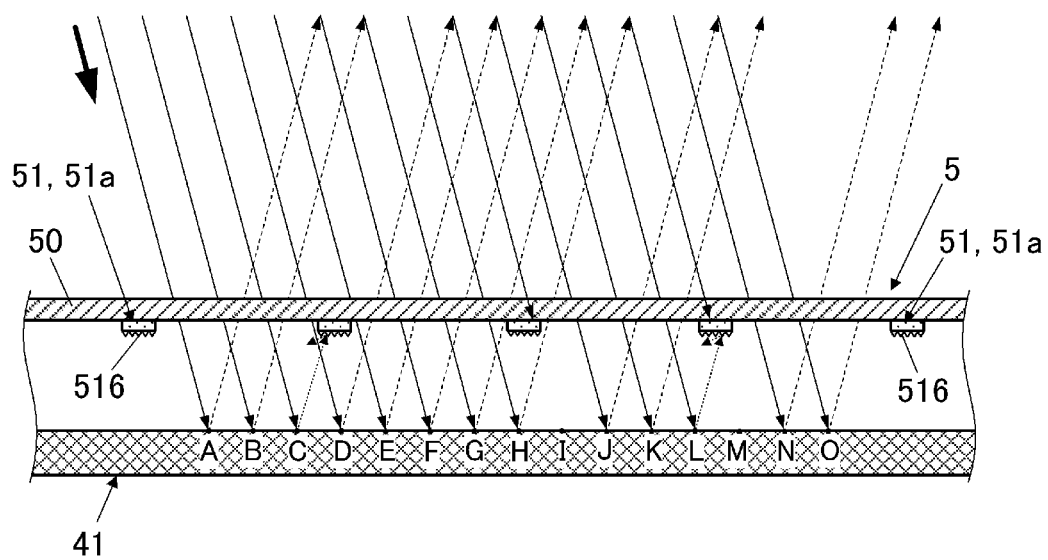
FIG. 7 is an illustration to explain reflection of light when light is incident on a solar panel of a modification of the embodiment.

FIG. 7 shows a case where a light diffuser 516 as an anti-reflector is provided on the surface of the power generators 51 (thin-line power generators 51a) facing the display panel 41.

The light diffuser 516 is provided, for example, by performing surface finishing on the surface of the back surface electrode 513 of the power generators 51 (thin-line power generators 51a) facing the display panel 41, the surface being in the mirror plane state, thereby forming fine asperities on the surface. The specific method of surface finishing is not particularly limited. For example, the light diffuser 516 is formed by roughening the surface of the layer with parts that are not subjected to the surface finishing masked.

The anti-reflector thus configured also makes the surface of the back surface electrode 513 facing the display panel 41 not specular, and hence, by diffusing (diffusely reflecting) light entering it, can prevent reflected light from appearing, the reflected light exerting influence on the user when looking at the display 41.

As in the above embodiment, this can provide the solar panel 5 that, thanks to the power generators 51 disposed in the display area of the display 4 too, has improved power generation efficiency, and does not affect the visibility of the display 4 (display panel 41), as well as the timepiece 100 in which this solar panel 5 is fitted.

Further, the shape of the solar panel 5 is not limited to the substantially circular shape shown for the above embodiment.

For example, the solar panel 5 may be elliptical, polygonal or the like.

Further, the shape of each solar cells C constituting the solar panel 5 is also not limited to the shape shown for the above embodiment. In the above embodiment, as shown in FIG. 2, the solar cells C are strips extending in a predetermined direction, L, but how the solar panel 5 is divided is not limited thereto.

Regardless of the shape of the solar cells C, the anti-reflector (e.g., light-absorbing layer 515) is provided on the surface of the power generators 51 facing the display panel 41, the power generators 51 being disposed in the area that coincides with the visible area VAr of the display panel 41.

Further, in the above embodiment, the thin-line power generators 51a are the power generators 51 each formed in the shape of a thin straight line extending along a certain direction, L, but the shape of the thin-line power generators 51a is not limited thereto.

For example, the thin-line power generators 51a may be concentric, spiral, radial or the like. Regardless of the shape thereof, the anti-reflector (e.g., light-absorbing layer 515) is provided on the surface of the power generators 51 (thin-line power generators 51a) facing the display panel 41.

Further, in the above embodiment, the solar panel 5 is fitted in the timepiece 100, but the electronic device in which the solar panel 5 is fitted is not limited to the timepiece 100.

The solar panel 5 is applicable to a wide range of electronic devices that generate electric power with the solar panel 5 and operate by the generated electric power as a driving source. Examples thereof include biological information display devices, such as a pedometer, a heart rate monitor and a pulse meter, and electronic devices that display various kinds of information, such as moved distance, moving pace information, altitude information and atmospheric pressure information.

Although one or more embodiments of the present invention have been described above, the scope of the present invention is not limited to the above-described embodiments, but includes the scope of the invention stated in claims and the scope of their equivalents.

INDUSTRIAL APPLICABILITY

Industrial applicability is in the field of electronic devices having a display panel.

The invention claimed is:

1. A solar panel that is provided on a visible side of a display panel, comprising:
   a transmissive area that transmits light;
   a power generator that generates electric power from light and includes a first power generator having at least a transmissive power generation area at a part corresponding to a display area of the display panel and a second power generator not having the transmissive power generation area; and
   an anti-reflector that is provided on a display-panel-facing surface of the power generator facing the display panel to prevent reflection of light on the power generator, the light being among light having passed through the transmissive area and been reflected by the display panel,
   wherein a square measure of the first power generator is larger than a square measure of the second power generator.

2. The solar panel according to claim 1,
   wherein, in the transmissive power generation area of the first power generator, a thin-line power generator that is a power generator formed in a shape of a line is provided, and
   wherein the anti-reflector is formed on the display-panel-facing surface of the thin-line power generator.

3. The solar panel according to claim 1,
   wherein the anti-reflector is a light absorber formed on the display-panel facing surface of the power generator.

4. The solar panel according to claim 1,
   wherein the anti-reflector is a light diffuser that is the display-panel-facing surface of the power generator having been subjected to a process to diffuse light.

5. The solar panel according to claim 1,
   wherein the anti-reflector has been subjected to a process to prevent specular reflection of light on the display-panel-facing surface of the power generator.

6. The solar panel according to claim 1,
   wherein the anti-reflector has been subjected to a process to make a reflectance of light in a range from 400 nm to 800 nm 40% or less.

7. An electronic device comprising:
   the solar panel according to claim 1;
   the display panel that is provided on an invisible side of the solar panel; and
   a body case that houses the solar panel and the display panel.

8. An electronic timepiece comprising:
   the solar panel according to claim 1;
   the display panel that is provided on an invisible side of the solar panel; and
   a body case that houses the solar panel and the display panel.

9. The solar panel according to claim 1,
   wherein a partition area is provided between the first power generator and the second power generator to separate the first power generator and the second power generator, and
   wherein the partition area has a width substantially equal to a width of the transmissive area.

10. The solar panel according to claim 1,
wherein the second power generator is disposed at a part not corresponding to the display area of the display panel.

11. The solar panel according to claim 1,
wherein the square measure of the first power generator is a sum of a square measure of the transmissive power generation area and a square measure of a power generation area that is not the transmissive power generation area.

12. The solar panel according to claim 1,
wherein the second power generator is not provided with the anti-reflector.

\* \* \* \* \*